(12) United States Patent
Cho et al.

(10) Patent No.: US 8,841,179 B2
(45) Date of Patent: Sep. 23, 2014

(54) NITRIDE SEMICONDUCTOR DEVICE USING SELECTIVE GROWTH AND MANUFACTURING METHOD THEREOF

(71) Applicant: LG Electronics Inc., Seoul (KR)

(72) Inventors: Seongmoo Cho, Seoul (KR); Kwangchoong Kim, Seoul (KR); Eujin Hwang, Anyang (KR); Taehoon Jang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/673,436

(22) Filed: Nov. 9, 2012

(65) Prior Publication Data
US 2013/0153921 A1    Jun. 20, 2013

(30) Foreign Application Priority Data
Dec. 14, 2011 (KR) .................. 10-2011-0134771

(51) Int. Cl.
| | |
|---|---|
| H01L 21/338 | (2006.01) |
| H01L 29/15 | (2006.01) |
| H01L 29/66 | (2006.01) |
| H01L 29/10 | (2006.01) |
| H01L 29/778 | (2006.01) |
| H01L 21/205 | (2006.01) |
| H01L 29/20 | (2006.01) |

(52) U.S. Cl.
CPC ........ *H01L 29/7783* (2013.01); *H01L 29/1054* (2013.01); *H01L 29/2003* (2013.01); *H01L 29/66522* (2013.01); *H01L 21/2056* (2013.01)
USPC .............. 438/172; 257/76; 257/194; 257/195

(58) Field of Classification Search
USPC ............ 257/76, 194–196, E21.403, E29.249, 257/E33.033, E33.034, E33.028, E33.025; 438/172
See application file for complete search history.

(56) References Cited

U.S. PATENT DOCUMENTS

| | | | |
|---|---|---|---|
| 8,044,409 B2* | 10/2011 | Yu et al. ......................... | 257/79 |
| 2007/0029573 A1* | 2/2007 | Cheng et al. ................... | 257/135 |
| 2008/0087915 A1* | 4/2008 | Uemoto et al. ................ | 257/192 |
| 2010/0097105 A1* | 4/2010 | Morita et al. .................. | 327/109 |
| 2010/0264460 A1* | 10/2010 | Grandusky et al. ........... | 257/190 |
| 2010/0289122 A1* | 11/2010 | Vaudo et al. ................... | 257/615 |
| 2011/0227093 A1* | 9/2011 | Hikita et al. ................... | 257/76 |

* cited by examiner

*Primary Examiner* — Cuong Q Nguyen
*Assistant Examiner* — Nishath Yasmeen
(74) *Attorney, Agent, or Firm* — McKenna Long & Aldridge LLP

(57) ABSTRACT

A semiconductor device including a first GaN layer, an AlGaN layer, a second GaN layer, a gate electrode, a source electrode, and a drain electrode sequentially stacked on a substrate, capable of improving a leakage current and a breakdown voltage characteristics generated in the gate electrode by locally forming a p type GaN layer on the AlGaN layer, and a manufacturing method thereof, and a manufacturing method thereof are provided. The semiconductor device includes: a substrate, a first GaN layer formed on the substrate, an AlGaN layer formed on the first GaN layer, a second GaN layer formed on the AlGaN layer and including a p type GaN layer, and a gate electrode formed on the second GaN layer, wherein the p type GaN layer may be in contact with a portion of the gate electrode.

14 Claims, 6 Drawing Sheets

US 8,841,179 B2

NITRIDE SEMICONDUCTOR DEVICE USING SELECTIVE GROWTH AND MANUFACTURING METHOD THEREOF

The present disclosure relates to subject matter contained in priority Korean Application No. 10-2011-0134771, filed on Dec. 14, 2011, which is herein expressly incorporated by reference in its entirety.

1. Field of the Invention

The present invention relates to a nitride semiconductor device using selective growth and a manufacturing method thereof.

2. Description of the Related Art

A nitride semiconductor, having the characteristics of a high threshold electric field, low ON resistance, resistance to high temperature, and high frequency operational characteristics, in comparison to silicon, has been studied as a material of a next-generation semiconductor device.

High output power devices include a metal-oxide-semiconductor field-effect transistor (MOSFET) and an insulated gate bipolar mode transistor (IGBT) as the mainstream, and recently, GaN-based devices such as high electron mobility transistor (HEMT), hetero-junction field effect transistor (HFET), MOSFET, and the like, have been studied.

In the case of the HEMT, it is used in a communication device having HF characteristics, or the like, by using high electron mobility, but in the case of the MOSFET, its effect is not remarkable due to an absence of a gate oxide film having excellent characteristics, difficulty in ion implantation and thermal diffusion for selectively forming a P type or N type region, or the like, over the physical characteristics of GaN.

FIG. 1 is an exemplary view showing a general structure of a hetero-junction field effect transistor (HFET).

Referring to FIG. 1, in a general HFET, a switching operation may be performed on a 2DEG (two-dimensional electron gas) current flowing from a drain electrode to a source electrode, through a schottky gate electrode.

A general HFET 10 may include a substrate (not shown), a first GaN layer 11, an AlGaN layer 12 formed on the first GaN layer, a second GaN layer 13 formed on the AlGaN layer, a gate electrode 14 formed on the second GaN layer, a source electrode 15, and a drain electrode 16.

In the case of the general HFET device, quality of schottky characteristics using a gate operation may significantly affect switch characteristics of the device. It is very important to minimize a leakage in the gate and enlarge a depletion region. Also, a technique of moving a threshold voltage (supply voltage) in a positive direction such that a current flow of a 2DEG channel in the hetero-junction structure is turned off at usual times is required.

SUMMARY OF THE INVENTION

An aspect of the present invention provides a semiconductor device including a first GaN layer, an AlGaN layer, a second GaN layer, a gate electrode, a source electrode, and a drain electrode sequentially stacked on a substrate, wherein a p type GaN layer is formed on the AlGaN layer to thereby reduce or remove a leakage current generated in a gate electrode and improve breakdown voltage characteristics, and a manufacturing method thereof.

In particular, in forming the p type GaN layer, the p type GaN layer can be re-grown horizontally, rather than, vertically, on the exposed (or open) second GaN layer by using a local oxidation film mask pattern. Thus, a semiconductor device having high reliability by minimizing lattice defect or a dislocation density and enhancing crystalline is provided.

According to an aspect of the present invention, there is provided a semiconductor device including: a substrate; a first GaN layer formed on the substrate; an AlGaN layer formed on the first GaN layer; a second GaN layer formed on the AlGaN layer and including a p type GaN layer; and a gate electrode formed on the second GaN layer, wherein the p type GaN layer may be in contact with a portion of the gate electrode.

In an embodiment in relation to the present disclosure, the second GaN layer may have a recess, and the p type GaN layer may be formed on the recess.

In an embodiment in relation to the present disclosure, the p type GaN layer may include a first layer and a second layer, and the first layer may be in contact with a lower portion of one side of the gate electrode, and the second layer may be in contact with a lower portion of the other side of the gate electrode.

In an embodiment in relation to the present disclosure, the p type GaN layer may include a plurality of layers, and the plurality of layers may be disposed to be spaced from one another in a horizontal direction.

In an embodiment in relation to the present disclosure, the p type GaN layer may be in contact with a portion of the AlGaN layer.

In an embodiment in relation to the present disclosure, the second GaN layer may have a hole, and the p type GaN layer may be formed to be insertedly formed in the hole.

In an embodiment in relation to the present disclosure, the p type GaN layer may be formed based on at least one of metal-organic chemical vapor deposition (MOCVD), molecular beam epitaxy (MBE), and hydride vapor phase epitaxy (HVPE).

In an embodiment in relation to the present disclosure, the p type GaN layer may be formed to have a thickness ranging from 1 nm to 100 nm.

In an embodiment in relation to the present disclosure, the p type GaN layer may have at least one of a trench shape, a V-groove shape, and a hemispherical shape.

In an embodiment in relation to the present disclosure, a concentration of p type impurities of the p type GaN layer may be within the range of $1e^{17}/cm^3 \sim 1e^{21}/cm^3$.

In an embodiment in relation to the present disclosure, the concentration of p type impurities of the p type GaN layer may be successively changed in a particular direction and by a particular slope.

In an embodiment in relation to the present disclosure, the p type GaN layer may be magnesium (Mg).

According to another aspect of the present invention, there is provided a method for manufacturing a semiconductor device, including: forming a first GaN layer on a substrate; forming an AlGaN layer on the first GaN layer; forming a second GaN layer on the AlGaN layer; forming an oxide film layer on the second GaN layer; selectively etching the oxide film layer to define a p type GaN region; etching the p type GaN region to form a recess on the second GaN layer; forming a p type GaN layer on the recess; removing the oxide film layer; and forming a gate electrode on the second GaN layer, wherein the p type GaN layer may be formed to be in contact with a portion of the gate electrode.

In an embodiment in relation to the present disclosure, the oxide film layer may include $SiO_2$.

In an embodiment in relation to the present disclosure, the oxide film layer may be formed to have a thickness ranging from 50 nm to 1000 nm.

According to embodiments of the present invention, a semiconductor device including a first GaN layer, an AlGaN layer, a second GaN layer, a gate electrode, a source electrode, and a drain electrode sequentially stacked on a substrate, wherein a p type GaN layer is formed on the AlGaN layer to thereby reduce or remove a leakage current generated in a gate electrode and improve breakdown voltage characteristics, and a manufacturing method thereof, are provided.

In particular, according to the semiconductor device disclosed in the present disclosure, since the p type GaN layer is locally formed on the AlGaN layer, a leakage of the gate electrode can be minimized and a depletion region is enlarged to allow a threshold voltage (supply voltage) to move in a positive direction.

Also, in case of using a selective growth in forming the p type GaN layer below the gate electrode of the semiconductor device, a lattice defect or dislocation density is minimized and crystalline is enhanced, thus increasing reliability of the device.

The foregoing and other objects, features, aspects and advantages of the present invention will become more apparent from the following detailed description of the present invention when taken in conjunction with the accompanying drawings.

DETAILED DESCRIPTION OF THE INVENTION

Figure 1:
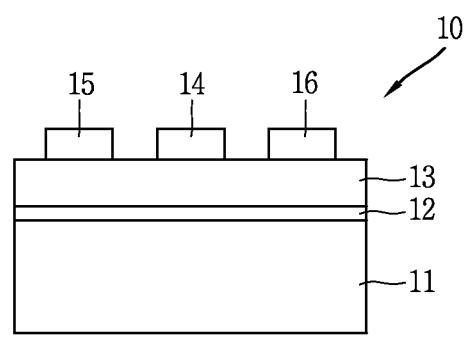
FIG. 1 is an exemplary view illustrating a general structure of a hetero-junction field effect transistor (HFET).

A technique disclosed in the present disclosure may be applied to a hetero-junction field effect transistor (HFET) and a manufacturing method thereof. However, the technique disclosed in the present disclosure is not limited thereto and may be applicable to any nitride-based semiconductor device and a manufacturing method thereof to which the technical concept of the technique is applicable. In particular, the technique may be applied to locally forming a p type GaN layer below a gate electrode of a nitride semiconductor device to move a threshold voltage (supply voltage) of the semiconductor device in a positive direction.

The terminology used herein is for the purpose of describing particular embodiments only and is not intended to be limiting of the invention. Unless otherwise defined, all terms used herein have the same meaning as commonly understood by one of ordinary skill in the art to which this invention pertains, and should not be interpreted as having an excessively comprehensive meaning nor as having an excessively contracted meaning. If technical terms used herein is erroneous that fails to accurately express the technical idea of the present invention, it should be replaced with technical terms that allow the person in the art to properly understand. The general terms used herein should be interpreted according to the definitions in the dictionary or in the context and should not be interpreted as an excessively contracted meaning.

As used herein, the singular forms "a", "an" and "the" are intended to include the plural forms as well, unless the context clearly indicates otherwise. In the present application, it is to be understood that the terms such as "including" or "having," and the like, are intended to indicate the presence of the features, numbers, operations, actions, components, parts, or combinations thereof disclosed in the specification, and are not intended to preclude the possibility that one or more other features, numbers, operations, actions, components, parts, or combinations thereof may exist or may be added.

While terms such as "first" and "second," and the like, may be used to describe various components, such components must not be understood as being limited to the above terms. The above terms are used only to distinguish one component from another. For example, a first component may be referred to as a second component without departing from the scope of rights of the present invention, and likewise a second component may be referred to as a first component.

The embodiments of the present invention will now be described with reference to the accompanying drawings, in which like numbers refer to like elements throughout, and a repetitive explanation will be omitted.

In describing the present invention, if a detailed explanation for a related known function or construction is considered to unnecessarily divert the gist of the present invention, such explanation has been omitted but would be understood by those skilled in the art. The accompanying drawings of the present invention aim to facilitate understanding of the present invention and should not be construed as limited to the accompanying drawings.

Description of Semiconductor Device According to Embodiments Disclosed in the Present Disclosure A semiconductor device according to embodiments disclosed in the present disclosure may include a substrate, a first GaN layer formed on the substrate, an AlGaN layer formed on the first GaN layer, a second GaN layer formed on the AlGaN layer and including a p type GaN layer, and a gate electrode formed on the second GaN layer, wherein the p type GaN layer may be in contact with a portion of the gate electrode.

Also, the second GaN layer may have a recess, and the p type GaN layer may be formed on the recess.

Also, the p type GaN layer may include a first layer and a second layer, and the first layer may be in contact with a lower portion of one side of the gate electrode, and the second layer may be in contact with a lower portion of the other side of the gate electrode.

Also, the p type GaN layer may include a plurality of layers, and the plurality of layers may be disposed to be spaced from one another in a horizontal direction.

Also, the p type GaN layer may be in contact with a portion of the AlGaN layer.

Also, the second GaN layer may have a hole, and the p type GaN layer may be formed to be insertedly formed in the hole.

Also, the p type GaN layer may be formed based on at least one of metal-organic chemical vapor deposition (MOCVD), molecular beam epitaxy (MBE), and hydride vapor phase epitaxy (HVPE).

Also, the p type GaN layer may be formed to have a thickness ranging from 1 nm to 100 nm.

Also, the p type GaN layer may have at least one of a trench shape, a V-groove shape, and a hemispherical shape.

Also, a concentration of p type impurities of the p type GaN layer may be within the range of $1e^{17}/cm^3 \sim 1e^{21}/cm^3$.

Also, the concentration of p type impurities of the p type GaN layer may be successively changed in a particular direction and by a particular slope.

Also, the p type GaN layer may be magnesium (Mg).

Figure 2:
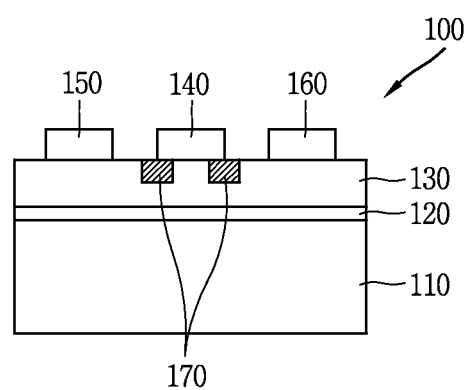
FIG. 2 is an exemplary view illustrating a structure of a semiconductor device according to embodiments disclosed in the present disclosure.

FIG. 2 is an exemplary view illustrating a structure of a semiconductor device according to embodiments disclosed in the present disclosure.

Referring to FIG. 2, a semiconductor device 100 according to an embodiment disclosed in the present disclosure may include a p type GaN layer forming a depletion layer according to a gate voltage applied to a gate electrode.

Namely, the semiconductor device 100 according to an embodiment disclosed in the present disclosure may include a substrate (not shown), a first GaN layer 110 formed on the substrate, an AlGaN layer 120 formed on the first GaN layer, a second GaN layer formed on the AlGaN layer and having recesses, a gate electrode 140 formed on the second GaN layer 130, and a p type GaN layer 170 formed on the recesses, wherein the p type GaN layer may be in contact with a portion of the gate electrode 140.

The substrate can be removed after fabrication of the semiconductor device 100. Therefore, the semiconductor device 100 may have a final structure without the substrate.

Also, the semiconductor device 100 according to an embodiment disclosed in the present disclosure may include a source electrode 150 and a drain electrode 160, and a DEG current flowing from the drain electrode 160 to the source electrode 150 may be switched through the schottky gate electrode.

Also, in the semiconductor device 100 according to an embodiment disclosed in the present disclosure, since the p type GaN layer 170 is formed above the AlGaN layer 120, a leakage current and a breakdown voltage characteristics generated in the gate electrode 140 can be enhanced.

Namely, the p type GaN layer 170 may serve to form a gate depletion region having high crystalline, a leakage current and breakdown voltage characteristics can be enhanced.

Also, the p type GaN layer 170 may be formed according to various methods. For example, the p type GaN layer 170 may be formed by implanting ions for selectively forming a p type and activating it through annealing.

Also, the p type GaN layer 170 may be formed through a method for selectively growing a nitride semiconductor crystal. For example, the p type GaN layer 170 may be formed based on at least one of metal-organic chemical vapor deposition (MOCVD), molecular beam epitaxy (MBE), and hydride vapor phase epitaxy (HVPE). In this case, however, in consideration of crystallinity of the p type GaN layer 170, the MOCVD method is generally used.

In forming the p type GaN layer 170, a method for selectively growing crystal may be advantageous in that it does not damage a semiconductor surface, not affecting GaN itself.

Also, the method for selectively growing crystal is advantageous in that a process is facilitated because the p type GaN layer 170 structure can be manufactured only through etching and re-growing.

Also, in re-growing, the p type GaN layer 170 is grown in a horizontal direction, rather than in a vertical direction in which dislocation, a defect, or the like, is formed therealong, whereby a lattice defect or a dislocation density can be significantly reduced. Thus, reliability considered to be the most important in a power device can be increased by reducing a defect density of crystal. Besides, it may be obvious to a person skilled in the art that various other methods for forming the p type GaN layer 170 may be applied to the method for manufacturing a semiconductor device disclosed in the present disclosure.

According to an embodiment disclosed in the present disclosure, the p type GaN layer 170 may be formed to have various thicknesses. For example, the p type GaN layer 170 may be formed to have a thickness ranging from 1 nm to 100 nm. Also, for example, the p type GaN layer 170 may be formed to have a thickness ranging from 5 nm to 10 nm. Besides, it may be obvious to a person skilled in the art that the p type GaN layer 170 is formed to have various other thicknesses.

Also, according to an embodiment disclosed in the present disclosure, the p type GaN layer 170 may include various p type impurities. For example, the p type impurities of the p type GaN layer 170 may be magnesium (Mg). Besides, it may be obvious to a person skilled in the art that the p type GaN layer 170 includes various other p type impurities.

Also, according to an embodiment of the present invention, the p type impurities of the p type GaN layer 170 may have various concentrations. For example, the concentration of the p type impurities of the p type GaN layer 170 may be within a range of $1e^{17}/cm^3 \sim 1e^{21}/cm^3$. Also, for example, the concentration of the p type impurities of the p type GaN layer 170 may be within a range of $1e^{18}/cm^3 \sim 1e^{20}/cm^3$.

Also, according to an embodiment of the present invention, the p type impurities of the p type GaN layer 170 may have various concentration distributions. For example, the p type impurities of the p type GaN layer 170 may have a uniform concentration distribution within the p type GaN layer 170. Also, for example, the p type impurities of the p type GaN layer 170 may have a concentration distribution successively changing in a particular direction and by a particular slope.

Besides, it may be obvious to a person skilled in the art that various other p type impurity concentrations and concentration distributions may be applied to form the p type GaN layer 170.

First Embodiment

A first embodiment disclosed in the present disclosure may be implemented by a portion or combination of the components or steps included in the foregoing embodiments or may be implemented by a combination of the embodiments. Hereinafter, repeated portions may be omitted for clarity of the first embodiment of the present disclosure.

A semiconductor device according to a first embodiment of the present invention may include a substrate, a first GaN layer formed on the substrate, an AlGaN layer formed on the first GaN layer, a second GaN layer formed on the AlGaN layer and including a p type GaN layer, and a gate electrode formed on the second GaN layer, wherein the p type GaN layer may be in contact with a portion of the gate electrode.

Also, according to the first embodiment of the present disclosure, the second GaN layer may have a recess, and the p type GaN layer may be formed on the recess.

Also, according to the first embodiment of the present disclosure, the p type GaN layer may include a first layer and a second layer, and the first layer may be in contact with a lower portion of one side of the gate electrode, and the second layer may be in contact with a lower portion of the other side of the gate electrode.

Also, according to the first embodiment of the present disclosure, the p type GaN layer may include a plurality of layers, and the plurality of layers may be disposed to be spaced from one another in a horizontal direction.

Also, according to the first embodiment of the present disclosure, the p type GaN layer may be in contact with a portion of the AlGaN layer.

Also, according to the first embodiment of the present disclosure, the second GaN layer may have a hole, and the p type GaN layer may be formed to be insertedly formed in the hole.

Figure 3A:
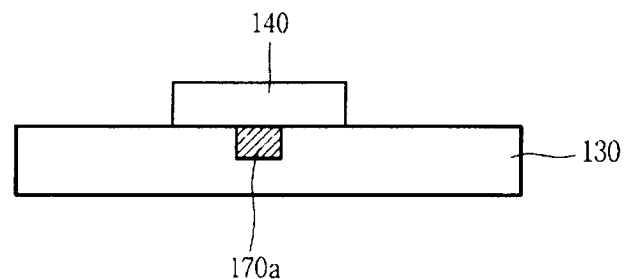
FIGS. 3A and 3D are exemplary views illustrating various dispositions of a p type GaN layer according to a first embodiment disclosed in the present disclosure.
Figure 3B:
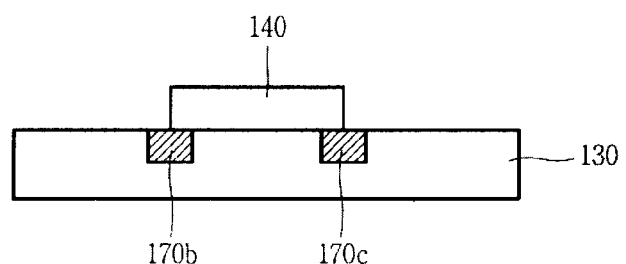
Figure 3C:
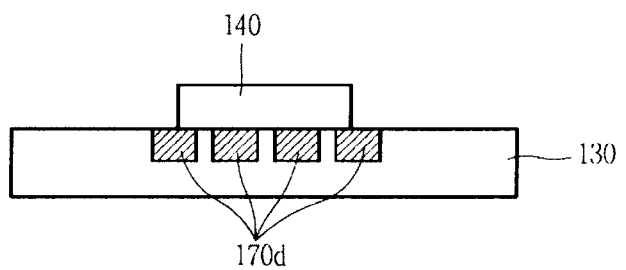
Figure 3D:
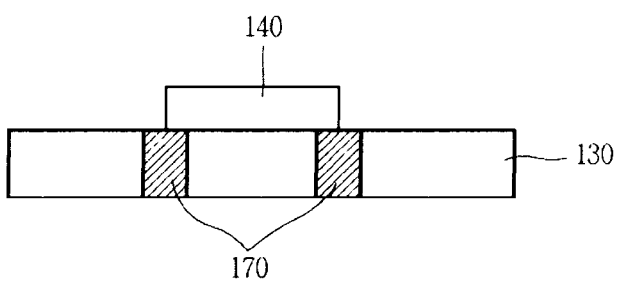

FIGS. 3A and 3D are exemplary views illustrating various dispositions of the p type GaN layer according to the first embodiment disclosed in the present disclosure.

Referring to FIGS. 3A and 3D, the p type GaN layer according to the first embodiment of the present invention may be formed according to various disposition schemes.

For example, the p type GaN layer 170 may be configured as a single layer 170a and formed to be in contact with a portion of a lower surface of the gate electrode 140 as shown in FIG. 3A.

Also, the p type GaN layer 170 may include a first layer 170b and a second layer 170c, and the first layer 170b may be in contact with a lower portion of one side of the gate electrode 140, and the second layer 170c may be in contact with a lower portion of the other side of the gate electrode 140 as shown in FIG. 3B.

Also, the p type GaN layer 170 may include a plurality of layers 170d, and the plurality of layers 170d may be formed to be disposed to be spaced apart from one another in a horizontal direction as shown in FIG. 3C.

Also, the p type GaN layer 170 may be in contact with a portion of the AlGaN layer 120. The p type GaN layer 170 may be in contact with a portion of the AlGaN layer 120 in various manners. For example, the second GaN layer 130 may have a hole, and the p type GaN layer 170 may be insertedly formed in the hole as shown in FIG. 3D.

Second Embodiment

A second embodiment disclosed in the present disclosure may be implemented by a portion or combination of the components or steps included in the foregoing embodiments or may be implemented by a combination of the embodiments. Hereinafter, repeated portions may be omitted for clarity of the second embodiment of the present disclosure.

A semiconductor device according to a second embodiment of the present invention may include a substrate, a first GaN layer formed on the substrate, an AlGaN layer formed on the first GaN layer, a second GaN layer formed on the AlGaN layer and including a p type GaN layer, and a gate electrode formed on the second GaN layer, wherein the p type GaN layer may be in contact with a portion of the gate electrode.

Also, according to the second embodiment of the present disclosure, the second GaN layer may have a recess, and the p type GaN layer may be formed on the recess.

Also, according to the second embodiment of the present disclosure, the p type GaN layer may be formed to have at least one of a trench shape, a V-groove shape, and a hemispherical shape.

Figure 4A:
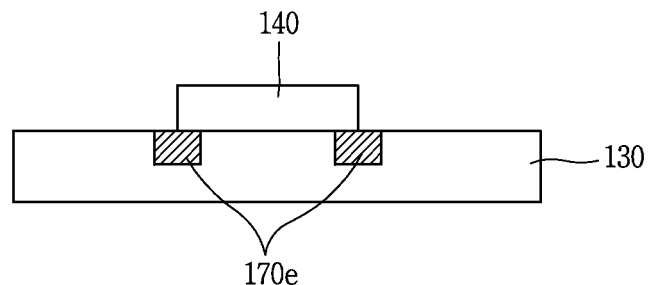
FIGS. 4A and 4C are exemplary views illustrating various dispositions of a p type GaN layer according to a second embodiment disclosed in the present disclosure.
Figure 4B:
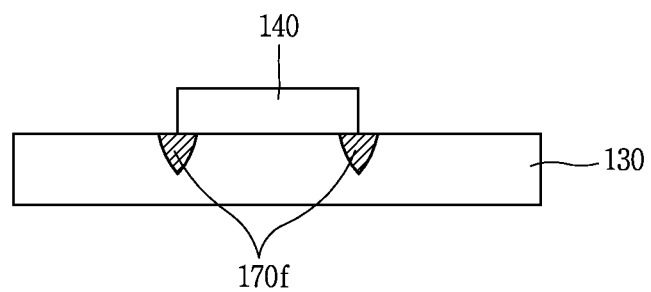
Figure 4C:
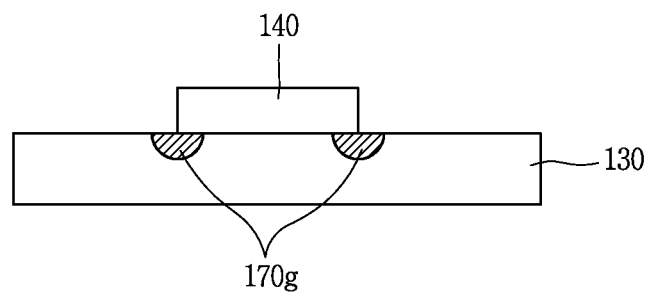

FIGS. 4A and 4C are exemplary views illustrating various dispositions of a p type GaN layer according to a second embodiment disclosed in the present disclosure.

Referring to FIGS. 4A and 4C, the p type GaN layer 170 may have various shapes.

For example, the p type GaN layer 170 may be a p type GaN layer 170e having a trench shape as shown in FIG. 4A.

Also, the p type GaN layer 170 may be a p type GaN layer 170f having a V-groove shape as shown in FIG. 4B.

Also, the p type GaN layer 170 may be a p type GaN layer 170g having a hemispherical shape as shown in FIG. 4C.

It may be obvious to a person skilled in the art that various other types of p type GaN layers 170 may exist.

Description of Method for Manufacturing Semiconductor Device According to Embodiments Disclosed in the Present Disclosure A method for manufacturing a semiconductor device according to embodiments disclosed in the present disclosure may include forming a first GaN layer on a substrate; forming an AlGaN layer on the first GaN layer; forming a second GaN layer on the AlGaN layer; forming an oxide film layer on the second GaN layer; selectively etching the oxide film layer to define a p type GaN region; etching the p type GaN region to form a recess on the second GaN layer; forming a p type GaN layer on the recess; removing the oxide film layer; and forming a gate electrode on the second GaN layer, wherein the p type GaN layer may be formed to be in contact with a portion of the gate electrode.

Also, the p type GaN layer may include a first layer and a second layer, and the first layer may be in contact with a portion at one side of the gate electrode, and the second layer may be in contact with a portion at the other side of the gate electrode.

Also, the p type GaN layer may be formed based on at least one of metal-organic chemical vapor deposition (MOCVD), molecular beam epitaxy (MBE), and hydride vapor phase epitaxy (HVPE).

Also, the oxide film layer may include $SiO_2$.

Also, the oxide film layer may be formed to have a thickness ranging from 50 nm to 1000 nm.

Also, the p type GaN layer may be formed to have a thickness ranging from 1 nm to 100 nm.

FIGS. 5A to 5I are exemplary views illustrating a method for manufacturing a semiconductor device according to embodiments disclosed in the present disclosure.

Referring to FIGS. 5A to 5I, the method for manufacturing a semiconductor layer according to embodiments disclosed in the present disclosure may include the following steps.

Figure 5A:
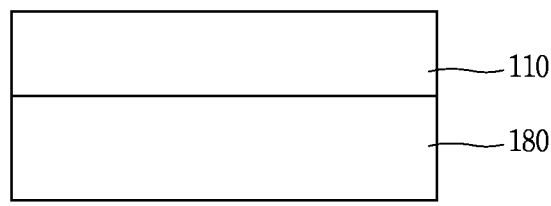
FIGS. 5A to 5I are exemplary views illustrating a method for manufacturing a semiconductor device according to embodiments disclosed in the present disclosure.
Figure 5B:
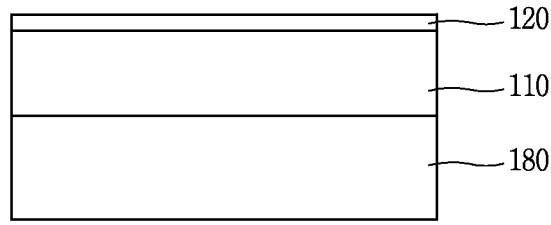

First, a first GaN layer 110 may be formed on a substrate 180 as shown in FIG. 5A, and an AlGaN layer 120 may be formed on the first GaN layer 110 as shown in FIG. 5B. Here, the first GaN layer 110 may be grown on a silicon (Si) substrate or a sapphire substrate. Besides, the first GaN layer may be grown on a GaN substrate or an SiC substrate. The first GaN layer 110 may be formed through epitaxial growth by synthesizing TMGa as a material of gallium (Ga) and $NH_3$ as a material of nitrogen (N) in a reactor at a high temperature. The first GaN layer 110 may be formed through an organic metal vapor growth method called as an MOCVD method.

Figure 5C:
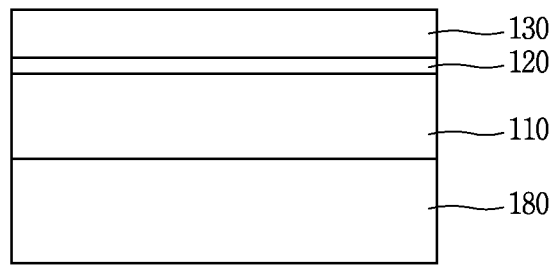

Next, the second GaN layer 130 may be formed on the AlGaN layer 120 as shown in FIG. 5C.

Figure 5D:
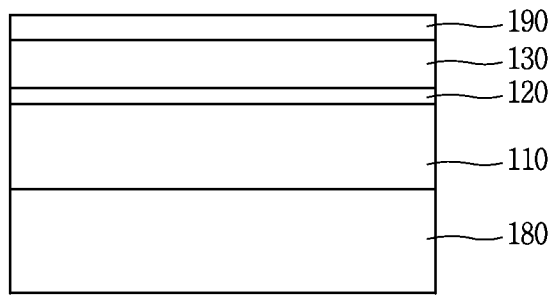

Next, the oxide film layer 190 may be formed on the second GaN layer 130 as shown in FIG. 5D.

The oxide film layer 190 may boost growth of the p type GaN layer 170 in a horizontal direction, while restraining a growth thereof in a vertical direction.

The oxide film layer 190 may be formed to have various thicknesses. For example, the thickness of the oxide film layer 190 may range from 50 nm to 1000 nm. Besides, it may be obvious to a person skilled in the art that oxide film layers having various other thicknesses are applied to the method for manufacturing a semiconductor device according to an embodiment disclosed in the present disclosure.

Also the oxide film layer 190 may be made of various materials. For example, the oxide film layer 190 may be made of $SiO_2$ so as to be easily removed.

Figure 5E:
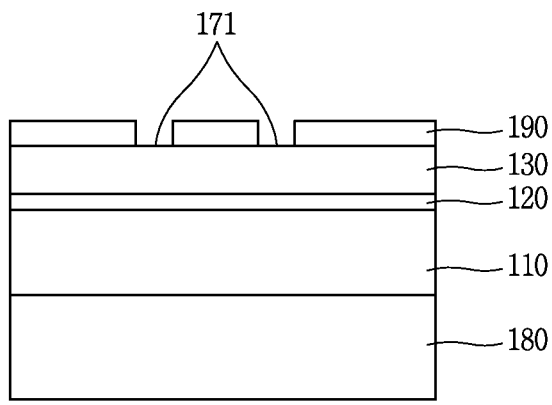

Next, the oxide film layer 190 is selectively etched to define p type GaN region 171 as shown in FIG. 5E.

The p type GaN region 171 may be defined by forming a local pattern through a photoresist process and etching only a region desired to be deposited to thus expose a surface of the second GaN layer 130.

Figure 5F:
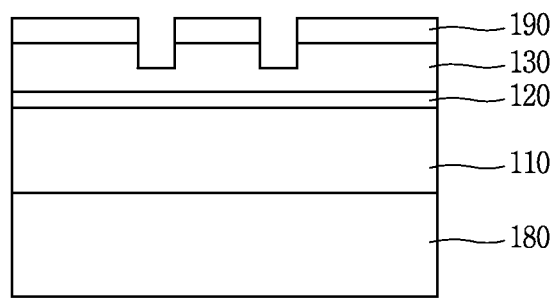

Next, the p type GaN region 171 is etched to form a recess on the second GaN layer 130. This may be to selectively grow the p type GaN layer 170 in a horizontal direction as shown in FIG. 5F.

Figure 5G:
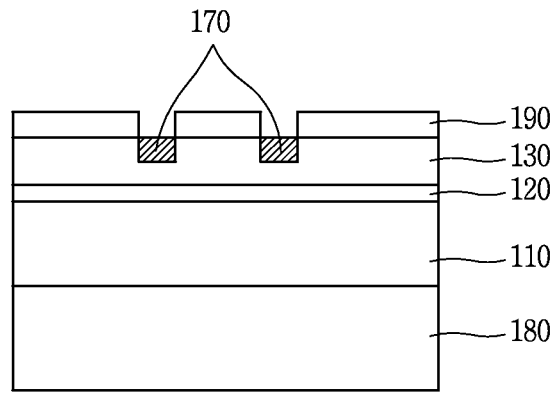

Next, the p type GaN layer 170 may be formed in the recess as shown in FIG. 5G.

The p type GaN layer 170 may be formed in a horizontal direction through a selective growth.

Various materials may be used as p type impurities of the p type GaN layer 170. For example, a dopant of the p type GaN layer 170 may be magnesium (Mg). In this case, the p type GaN layer 170 may be grown by doping magnesium (Mg) together with TMGa and NH$_3$.

Also, the p type GaN layer 170 may include impurities having various concentrations. For example, the concentration of p type impurities of the p type GaN layer 170 may be within the range of $1e^{17}/cm^3 \sim 1e^{21}/cm^3$. Also, for example, the concentration of p type impurities of the p type GaN layer 170 may be within the range of $1e^{18}/cm^3 \sim 1e^{20}/cm^3$. Besides, it may be obvious to a person skilled in the art that various p type impurity concentrations may be applied to form the p type GaN layer 170.

The p type GaN layer 170 may have various thicknesses. For example, the p type GaN layer 170 may be formed to have a thickness ranging from 1 nm to 100 nm. Also, for example, the p type GaN layer 170 may be formed to have a thickness ranging from 5 nm to 10 nm. Besides, it may be obvious to a person skilled in the art that the p type GaN layer 170 may be formed to have various thicknesses.

Figure 5H:
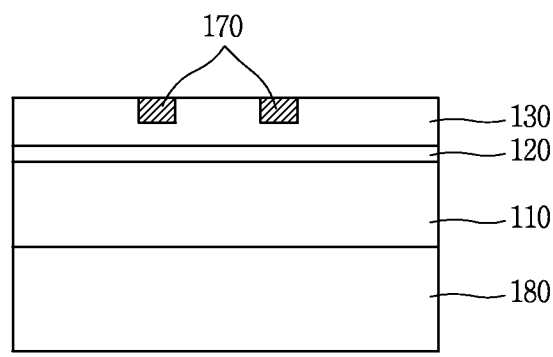

Next, the oxide film layer 190 may be removed as shown in FIG. 5H.

For example, the oxide film layer 190 may be removed by using BOE etching chemical.

Figure 5I:
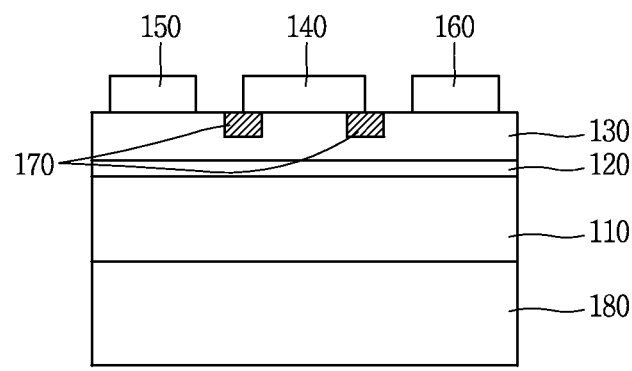

Next, the gate electrode 140, the source electrode 150, and the drain electrode 160 may be formed on the second GaN layer 130 as shown in FIG. 5I.

Also, in order to prevent a surface leakage current, additionally, an oxide film (not shown) may be formed on the second GaN layer 130 and the electrodes may be open.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A semiconductor device comprising:
    a substrate;
    a first GaN layer formed on the substrate;
    an AlGaN layer formed on the first GaN layer;
    a second GaN layer formed on the AlGaN layer and including a p type GaN layer; and
    a gate electrode formed on the second GaN layer,
    wherein the p type GaN layer is in contact with a portion of the gate electrode and includes a first layer and a second layer,
    wherein the first layer is in contact with a lower portion of one side of the gate electrode, and the second layer is in contact with a lower portion of the other side of the gate electrode, and
    wherein the second GaN layer has a recess, and the p type GaN layer is formed in the recess.

2. The semiconductor device of claim 1, wherein the p type GaN layer includes a plurality of layers, and the plurality of layers are disposed to be spaced from one another in a horizontal direction.

3. The semiconductor device of claim 1, wherein the p type GaN layer is in contact with a portion of the AlGaN layer.

4. The semiconductor device of claim 1, wherein the p type GaN layer is formed based on at least one of metal-organic chemical vapor deposition (MOCVD), molecular beam epitaxy (MBE), and hydride vapor phase epitaxy (HVPE).

5. The semiconductor device of claim 1, wherein the p type GaN layer is formed to have a thickness ranging from 1 nm to 100 nm.

6. The semiconductor device of claim 1, wherein the p type GaN layer has a trench shape, a V-groove shape, or a hemispherical shape.

7. The semiconductor device of claim 1, wherein a concentration of p type impurities of the p type GaN layer is within a range of $1e^{17}/cm^3 \sim 1e^{21}/cm^3$.

8. The semiconductor device of claim 1, wherein the concentration of p type impurities of the p type GaN layer is successively changed in a particular direction and by a particular slope.

9. The semiconductor device of claim 1, wherein the p type GaN layer is magnesium (Mg).

10. A method for manufacturing a semiconductor device, the method comprising:
    forming a first GaN layer on a substrate;
    forming an AlGaN layer on the first GaN layer;
    forming a second GaN layer on the AlGaN layer;
    forming an oxide film layer on the second GaN layer;
    selectively etching the oxide film layer to define a p type GaN region;
    etching the p type GaN region to form a recess on the second GaN layer;
    forming a p type GaN layer on the recess;
    removing the oxide film layer; and
    forming a gate electrode on the second GaN layer,
    wherein the p type GaN layer is formed to be in contact with a portion of the gate electrode, and
    wherein the p type GaN layer includes a first layer and a second layer, and the first layer is in contact with a lower portion of one side of the gate electrode, and the second layer is in contact with a lower portion of the other side of the gate electrode.

11. The method of claim 10, wherein the p type GaN layer is formed based on at least one of metal-organic chemical vapor deposition (MOCVD), molecular beam epitaxy (MBE), and hydride vapor phase epitaxy (HVPE).

12. The method of claim 10, wherein the oxide film layer includes SiO$_2$.

13. The method of claim 10, wherein the oxide film layer is formed to have a thickness ranging from 50 nm to 1000 nm.

14. The method of claim 10, wherein the p type GaN layer is formed to have a thickness ranging from 1 nm to 100 nm.

* * * * *